(12) United States Patent
Sandbote

(10) Patent No.: US 7,464,361 B2
(45) Date of Patent: Dec. 9, 2008

(54) SYSTEM AND METHOD FOR ASYNCHRONOUS LOGIC SYNTHESIS FROM HIGH-LEVEL SYNCHRONOUS DESCRIPTIONS

(75) Inventor: Sam Brandon Sandbote, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 262 days.

(21) Appl. No.: 11/040,761

(22) Filed: Jan. 21, 2005

(65) Prior Publication Data

US 2005/0160392 A1    Jul. 21, 2005

Related U.S. Application Data

(60) Provisional application No. 60/537,873, filed on Jan. 20, 2004.

(51) Int. Cl.
*G06F 17/50* (2006.01)
(52) U.S. Cl. .................. 716/18; 716/1; 716/7
(58) Field of Classification Search ............ 716/1, 716/7, 18
See application file for complete search history.

(56) References Cited

U.S. PATENT DOCUMENTS 7,065,665 B2 *   6/2006   Jacobson et al. ............ 713/400

* cited by examiner

*Primary Examiner*—Thuan Do
(74) *Attorney, Agent, or Firm*—Ronald O. Neerings; Wade James Brady, III; Frederick J. Telecky, Jr.

(57) ABSTRACT

A method for generating an equivalent asynchronous handshake circuit from a synchronous description of its intended behavior.

6 Claims, 7 Drawing Sheets

```
always @ (posedge clk) begin
  A <= C[3:0] & (B << 1);
  B <= A[2:0] | C[2:0];
  C <= (A[2:0] ^ B) & {c[0],(C >> 1)};
end
```

SYSTEM AND METHOD FOR ASYNCHRONOUS LOGIC SYNTHESIS FROM HIGH-LEVEL SYNCHRONOUS DESCRIPTIONS

This application is claims priority to application 60/537,873 filed Jan. 20, 2004.

FIELD OF THE INVENTION

The invention relates to digital logic. In particular, the invention relates to the methodology used to design asynchronous handshake digital logic circuits.

BACKGROUND OF THE INVENTION

In the design of digital logic, it is a fundamental task to be able to sequence behavior in time where required. For example, an operation X must not be activated without its proper data operands A and B ready and available, and any other operations Y and Z which use the result of X must both be finished and ready to accept a new result from X. The former requirement is known as a dependency, and the latter known as an antidependency.

Synchronous logic solves the problem of sequencing behavior in digital designs by activating all operations on the occurrence of a single, global event. This global event is the rising or falling edge of a periodic clock signal. Contrarily, asynchronous logic solves the problem of sequencing behavior by activating operations based on the occurrence of many distributed, largely unrelated, and highly localized events. These events are the rising or falling edges of potentially any logic gate within the design.

Unlike the synchronous design style with a global clock signal, asynchronous logic design is extremely variegated. A wide variety of styles exist as known art. Each of these styles of asynchronous logic may be classified according to several distinguishing features as here described.

Firstly, each of these styles is distinguished by the size of the operation activated by a local event. In some styles, a local event activates the processing of an entire datapath of logic. For example, the multiplication of two 32-bit operands to form a 64-bit result might be controlled by a single local event. Such would be said to be very coarse-grained asynchronous event control. In other styles of asynchronous logic, local events are identifiable as a signal to activate the logical NAND of two bits in only a single gate. Such would be said to be very fine-grained event control.

Styles of asynchronous logic which share the same granularity of event control are further distinguished by a multitude of logical communication protocols used to generate the local events based on the occurrence of other events in the asynchronous logic. In some cases simply the change in state of a signal, any edge or level change, may generate an event. This is known in the language of asynchronous logic as a two-phase signaling protocol. In other cases, both a rise and fall of a signal in series are required to generate a local event. This is known as a four-phase signaling protocol.

The safe design of any logic, whether synchronous or asynchronous, depends on assumptions made about timing. All logic in synchronous designs, for example, must take less time than the period of the global clock for proper safety. Asynchronous logic is no different in that timing assumptions put constraints on design.

Because a local event present in asynchronous logic represents a designer's intentional sequencing of overall behavior, it inevitably requires information from its dependencies and antidependencies in order to activate. Thus, each local event is generated based on a collection of occurrences of other events. All events related to dependencies for the operation must be collected to ensure the operation is guaranteed to have the correct data values available. This is known in the jargon of computer science as a join. More, all events related to antidependencies must be collected to ensure that the operation may activate safely without adversely affecting another. This is known in the jargon of computer science as a fork.

A fork or join may also have arbitration involved with event control. Operation X, which uses operands A and B, might hypothetically take A from more than one source. Operation X would be activated when A, and either B1 or B2, were available. Similarly, once X is activated and its result is ready, this result might be delivered to Y and either Z1 or Z2, but not both. Selection of the source of B, and the selection of Z, may be either explicitly directed by another signal, or left to chance as a "first-come-first served" policy. Arbitration is involved in event control wherever an EITHER-OR of events is required before the activation of an operation. It is not necessary wherever a simple AND of events is required to activate an operation.

Before an operation is activated, its joins must complete and its forks must be free to accept the operation's output. This requirement is universally true in asynchronous logic design of any style, for any safe and correctly behaving design. However, asynchronous logic styles distinguish how this timing guarantee is made and at what cost. There is a direct relationship between making a universal guarantee and the resulting circuit size or cost. There is also a direct relationship associated with satisfying the constraints that result from a partial timing correctness guarantee and the implementation complexity of such logic. Implementation complexity negatively impacts a CAD tool or human designer of the physical circuit.

Delay insensitive asynchronous logic ensures that under all circuit conditions, the guarantee of timing correctness is inherently met, no matter the implementation. Building completely delay-insensitive asynchronous logic inevitably involves more safety which must be satisfied by more gates. In some cases this absolute guarantee deteriorates performance because of the more robust event signaling protocol which must be used. Both leakage and switching power in a CMOS transistor implementation are necessarily higher. Nevertheless, delay insensitive asynchronous logic is extremely robust and expedient for numerous applications, and therefore a common style.

Other styles of asynchronous logic make the guarantee of timing correctness while ignoring the delay of wires. During physical implementation of the design, each wire attached to a gate contains a hard and fast time delay constraint, beyond which the entire logic design no longer operates safely. For a design of modern proportions, containing hundreds of thousands or millions of such wires, this assumption is usually unmanageable.

The bundled-delay constraint is the most common trade-off between circuit cost and implementation complexity. A group of logic paths, such as those within a multiplier producing a product from two operands, are grouped. The worst-case delay of this bundled datapath is given a timing constraint, and with this timing constraint the guarantee of timing correctness of the overall asynchronous logic design is made. Clearly, reducing the number of timing constraints by orders of magnitude ameliorates a great burden on implementation complexity. At the same time, avoiding the absolute guarantee of timing correctness that delay insensitive logic makes allows for far less bulky and expensive circuitry.

In all physically implemented asynchronous logic circuits, 100% of the timing constraints derived from the correctness assumptions are met in order to guarantee correct behavior. However, variations in the timing of individual logic paths do exist between different physical circuit embodiments of the same asynchronous logic design, each of which meet all of these timing constraints, operate safely and correctly. These logic path variations appear as symptoms of many perturbations including minute variances in manufacturing, differences in the voltage or temperature at which the circuits operate, and most importantly, different circuit implementations.

When event control involves arbitration due to an EITHER-OR condition, the logic will have correct but non-deterministic behavior because of these timing variations. Operation X involves a join which waits for either B1 or B2 to arrive, and activates based on whichever event arrives first. The race condition between B1 and B2 will see-saw back and forth because of timing variations, and therefore the order of processing in the asynchronous design may change. This nondeterminism is not a fatal flaw, as the overall behavior is correct. However, nondeterminism makes testing of asynchronous logic designs extremely difficult, as the same input applied repetitively to the same physical circuit yields results in different order each time.

For describing any logic design textually, a hardware description language or HDL is used. Since the advent of logic synthesis in the late 1980s, the HDL has become not only a description of the design for purposes of simulation or documentation, but also the way designs are entered and captured. For synchronous design, the HDLs Verilog and VHDL are standardized design entry languages well known in the world community of engineers. HDLs for asynchronous design entry have struggled for standardization and acceptance due to the complexities of describing the asynchronous event control.

"Micropipelines" constitute a style of asynchronous logic characterized by coarse-grain event control of a stage of bundled-delay datapath, bounded by locally clocked registers at the start and end. The structure is similar to a synchronous pipeline stage. A set of discrete building blocks for event control, well-known to those skilled in the art, is associated with this style. These building blocks allow for AND, EITHER-OR and signal-controlled OR of events, for both forking and joining. Between the set of locally clocked registers under event control, the datapath has a known worst-case bundled delay. A handshake protocol with request and acknowledge signals is set up between the controllers of all local clocks in the design.

For a single Micropipeline stage, a request signal is sent forward from the start register of the pipe stage in the direction of the datapath to the end register when new operands A and B are both ready to be clocked and enter the combinatorial stage. This request is derived from a join event of A and B. An acknowledge signal is sent backward from the end register opposite of the direction of the datapath to the start, when the output of the stage has been safely latched. When request and acknowledge correspond, registers at the start of the stage are clocked, activating the operation of the datapath with the new A and B operands.

In order to satisfy the bundled-delay timing constraint and guarantee timing correctness of a Micropipeline stage, a delay is intentionally added to the forward request signal, which causes the request to arrive at the end in the same amount of time as the worst-case delay through the datapath within the stage. This matched delay element is among the basic building blocks which characterize Micropipelines.

SUMMARY OF THE INVENTION

A system and method for asynchronous logic synthesis from high-level synchronous descriptions. More particularly, a method is disclosed for generating an equivalent asynchronous handshake circuit from a synchronous description of its intended behavior.

BRIEF DESCRIPTION OF THE DRAWINGS

The features and advantages of the present invention will become apparent from the following detailed description of the present invention in which.

DETAILED DESCRIPTION OF THE INVENTION

In the following description, for purposes of explanation, numerous details are set forth in order to provide a thorough understanding of the present invention. However, it will be apparent to one skilled in the art that these specific details are not required in order to practice the present invention. In some instances, well-known electrical structures and circuits are shown in symbolic or block diagram form in order not to obscure the present invention.

Figure 1:
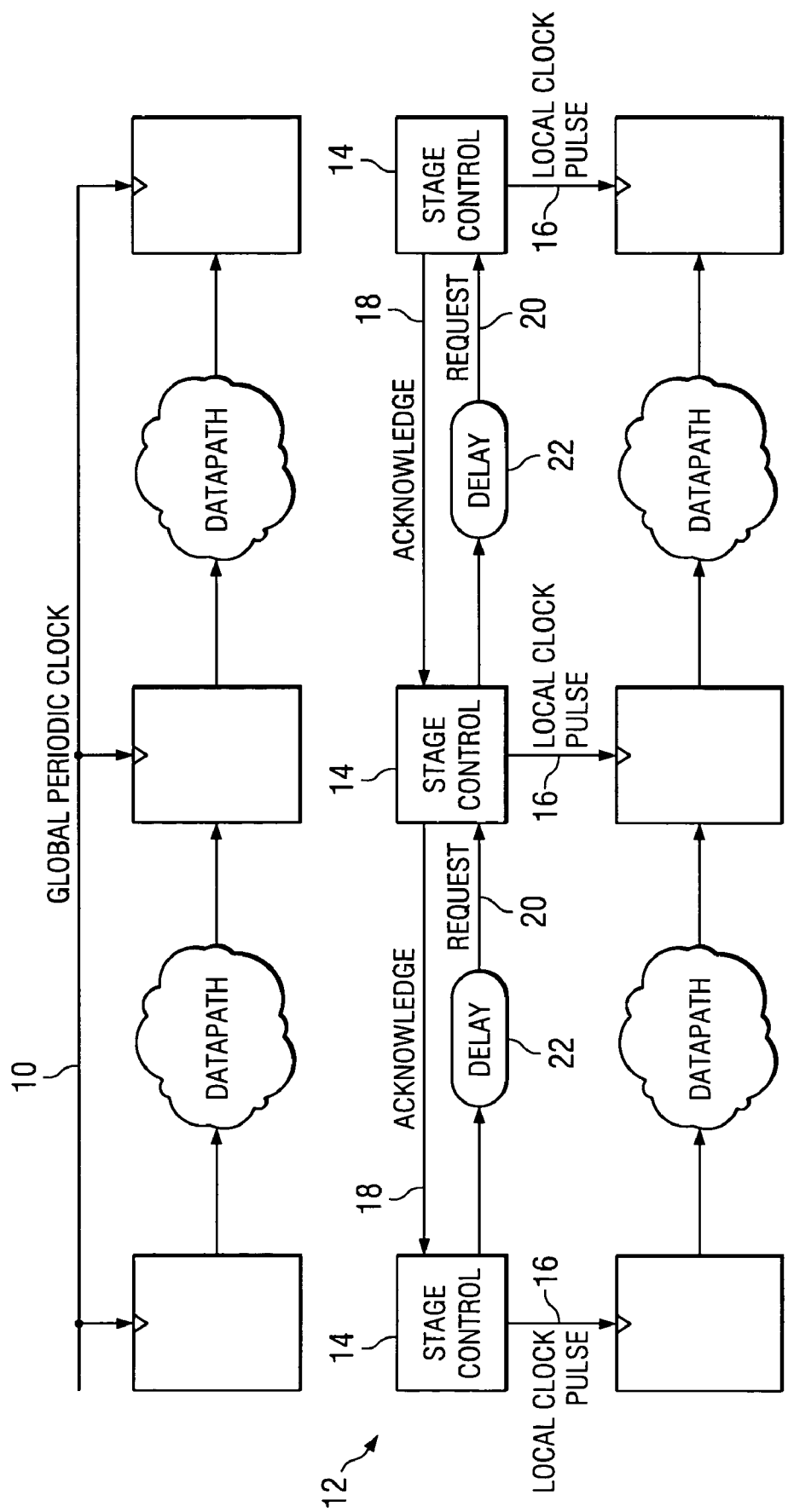
FIG. 1 is a diagram illustrating an example of the fundamental transformation from synchronous logic to asynchronous handshakes, for which the present invention is employed.

FIG. 1 is a diagram illustrating an example of the fundamental transformation from synchronous logic to Micropipelines using asynchronous handshakes, for which the present invention is employed. The global clock 10 in an original synchronous design is replaced by a two-phase asynchronous handshake network 12. Each bank of state elements in the original design is replaced with stage control logic 14 including a local clock 16, backwards acknowledge signal 18 and request signal 20 delayed by a matched delay element 22. The present invention ensures that the two designs have equivalent behavior.

Figure 2:
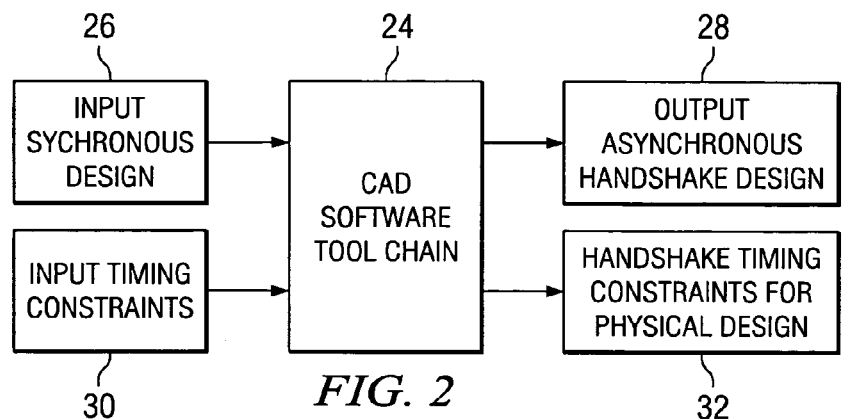
FIG. 2 is a diagram illustrating a system in which one embodiment of the invention can be practiced.

FIG. 2 is a diagram illustrating a system in which one embodiment of the invention can be practiced. A software tool chain 24 accepts an original synchronous logic design 26 as input and outputs a transformed version 28 using asynchronous handshakes. Portions of the tool chain also accept timing constraints 30 on the original synchronous design 26. The tool chain also generates the proper timing constraints 32 as output for physical circuit design. These output timing constraints 32 are required to meet the bundled-delay timing correctness guarantee involved in Micropipelines.

Figure 3:
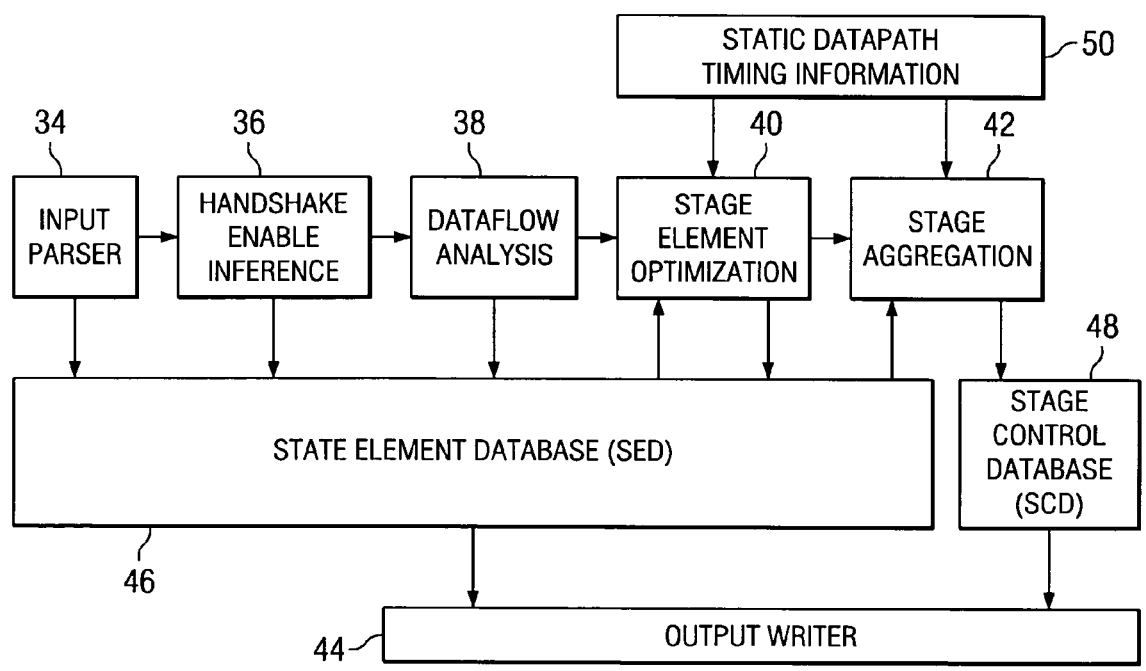
FIG. 3 is a diagram illustrating an example of the application of the several processing steps involved in the tool chain shown in FIG. 1, according to one embodiment of the invention.

FIG. 3 is a diagram illustrating an example of the application of the several processing steps involved in the tool chain shown in FIG. 1, according to one embodiment of the invention. Although the tool chain is illustrated in a serial manner here, several of the processing steps may proceed in parallel or in a different order. The tool chain involves a parser 34, handshake enable inference processing 36, analysis of the dataflow dependencies and antidependencies of state elements 38, state element optimization 40, a clustering algorithm 42 to aggregate state elements into Micropipeline stages, final processing to determine the reset values involved in the stage control logic, and an output writer 44. These processing steps interact with two shared databases: a state element database 46, hereafter referred to as the SED, and a stage control database 48, hereafter referred to as the SCD. Several processing steps also may take information about timing of the datapaths in the original synchronous design 50.

The parser 34 interprets a description of the original synchronous design. In one embodiment of the invention, the original synchronous design is expressed in a textual file format. The description of the original synchronous design may be either HDL code or a low-level netlist of logic gates.

The handshake enable inference processing 36 identifies signals which can be used for handshake stage enables from syntactical clues in an HDL design description, or from structural or logical clues in a netlist input. The analysis of the dataflow dependencies and antidependencies of state elements involves tracing logic paths in the synchronous input between state elements plus the design's inputs and outputs.

The state element optimization processing step 40 moves portions of logic between sides of a pipeline register, a common process known to those skilled in the art as register retiming. Unique to the present invention, however, is the ability of this processing step to remove these pipeline registers entirely if they do no forking or joining other than with the stages preceding and following it.

The clustering algorithm 42 optimally aggregates state elements into Micropipeline stages, potentially in a much different manner than the state elements were grouped as register bits in the original synchronous design. The output writer 44 uses the information organized by previous processing steps in the two databases SED and SCD to output a description of a Micropipeline design with asynchronous handshakes which has behavior identical to that of the original synchronous input.

Figure 4:
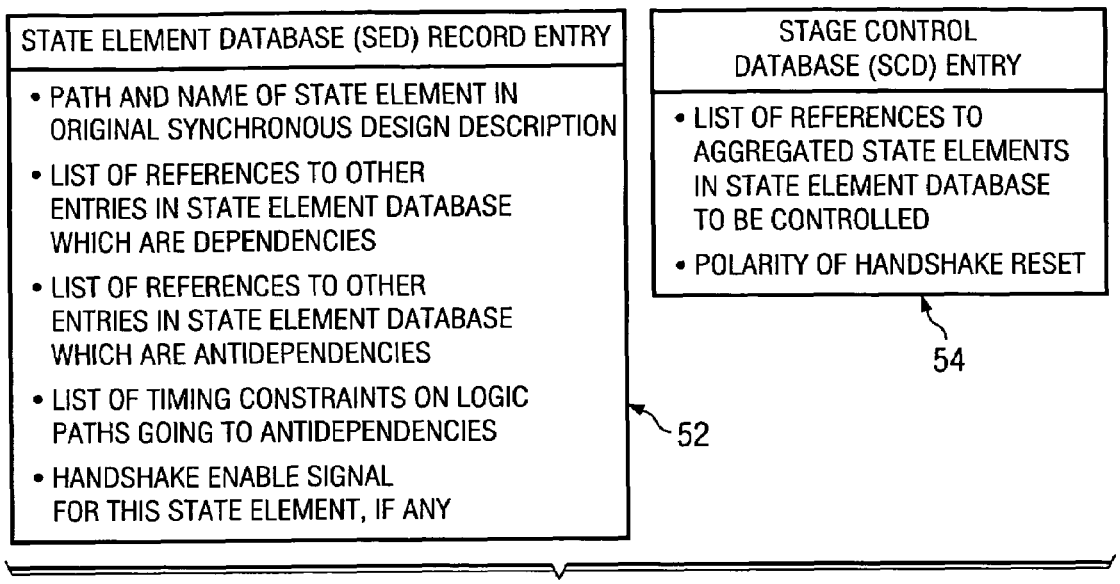
FIG. 4 is a diagram illustrating an example of the contents of a record in the two databases shown in FIG. 3, according to one embodiment of the invention.

FIG. 4 is a diagram illustrating an example of the contents of a record in each of the two databases 46 and 48 shown in FIG. 3, according to one embodiment of the invention. The SED stores a record of information 52 for each state element in the original synchronous design, which will ultimately become state elements in the asynchronous Micropipeline result. In one embodiment of the invention such a record for a state element may contain, among other data items: its path and name in original synchronous design description, a list of references to its dependencies and antidependencies, a list of timing constraints imported from the datapath timing information 50, and its associated handshake enable signal if one was inferred during handshake enable inference processing step 36.

During the stage aggregation processing step 42, the SCD is created to store a record of information 54 for each Micropipeline stage. In one embodiment of the invention such a record for each stage may contain, among other data items: a list of the state elements which were aggregated into the given stage, and information about how the stage's handshake control logic is to be reset.

Figure 5:
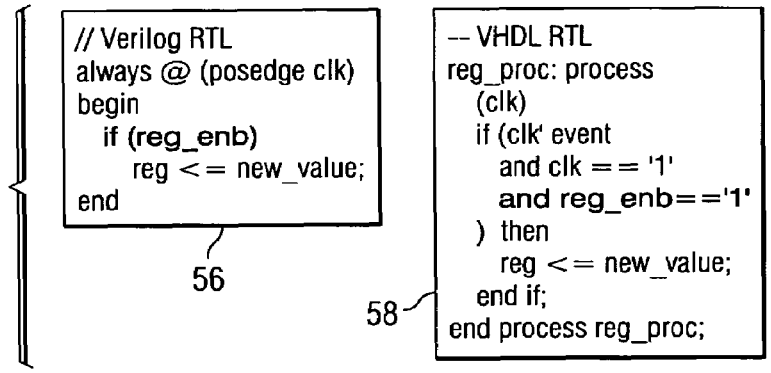
FIG. 5 is a diagram illustrating an example of syntactical clues left by a designer in the input synchronous HDL design description, used to infer a handshake stage enable, according to one embodiment of the invention.

FIG. 5 is a diagram illustrating an example of syntactical clues 56 and 58 left by a designer in the input synchronous HDL design description, used to infer a handshake stage enable, according to one embodiment of the invention. These syntactical clues are detected in the synchronous HDL design description when an extra condition must be met in addition to the clock edge event before a register is clocked and an operation is activated.

Figure 6:
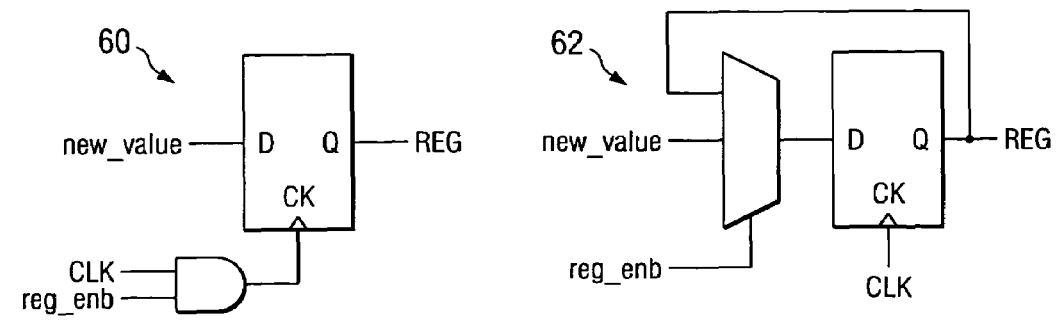
FIG. 6 is a diagram illustrating an example of structural or logical clues in the gate-level netlist of the input synchronous design, used to infer a handshake stage enable, according to one embodiment of the invention.

FIG. 6 is a diagram illustrating an example of structural 60 or logical 62 clues in the gate-level netlist of the input synchronous design, used to infer a handshake stage enable, according to one embodiment of the invention. Structural clues include the presence of logic gating in the clock network. Logical clues include the presence of a mux directly in front of a storage element which takes as input the recycled value held by the storage element. Either structural clues 60 or logical clues 62 may be artifacts of logic synthesis tools which generated the gate-level netlist.

Figure 7:
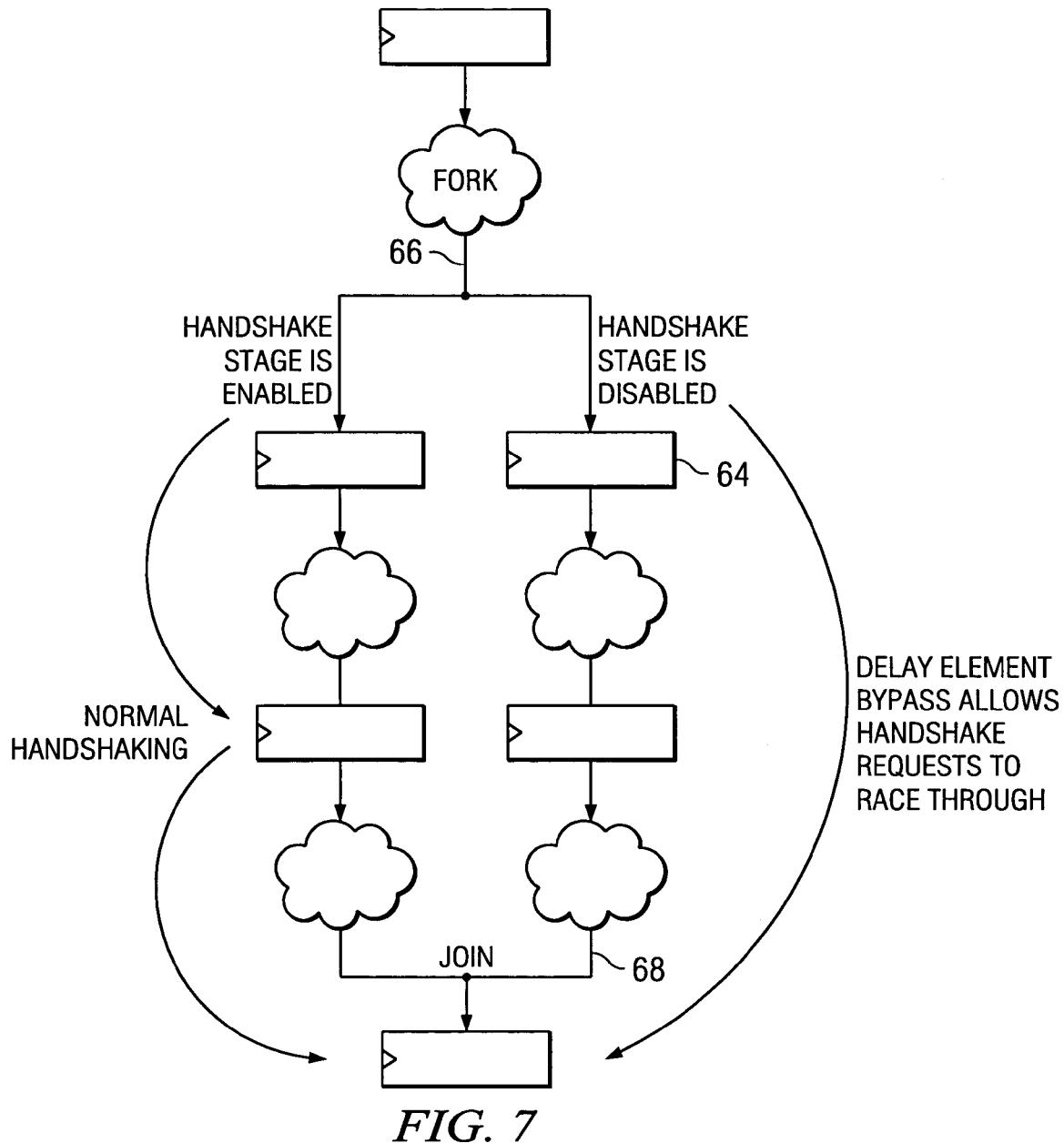
FIG. 7 is a diagram illustrating the utility of the matched delay element bypass mechanism in the handshake control, according to one embodiment of the invention.

FIG. 7 is a diagram illustrating the utility of the matched delay element bypass mechanism in the handshake control, according to one embodiment of the invention. The present invention enables the handshake control logic to ignore the normal matched delay elements 22 shown in FIG. 1, and complete the handshake protocol at maximum speed when the stage is not enabled.

When a particular stage 64 is part of a fork in the Micropipeline design and it is disabled, handshaking in the forked path continues regardless of the fact that local clocks are not pulsed, operations are not activated, and data in the datapath does not change. This case is illustrated on the right side of the figure. The stages 64 on the left side of the FIG. 7 are part of an enabled fork. Handshakes cause local clocks on the left to activate processing normally. The join point 66 at the bottom of the figure will always wait for a request from both sides of the figure to complete before handshaking and proceeding. However, the race-through essentially collapses the stage time to zero for each stage on the right, ensuring that the request signal indicating the right side is done arrives at the join point as fast as possible.

The present invention uses only event logic of the AND-variety as described in the background text, in order to completely avoid nondeterminism in the resulting asynchronous Micropipeline design. EITHER-OR event logic, which introduces nondeterminism, is never used. The present invention's matched delay bypass mechanism enables the creation of fast deterministic arbiters which still match the behavior of an original synchronous design.

Figure 8:
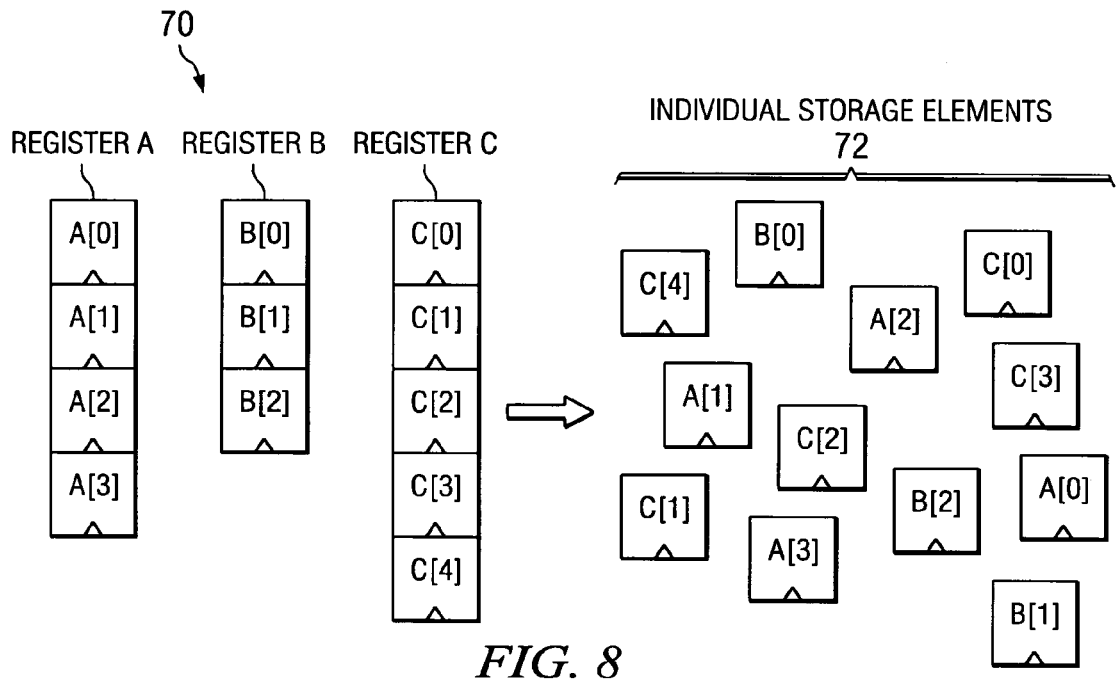
FIG. 8 is a diagram illustrating the separation of registers in an example input synchronous HDL design description into individual state elements for analysis, according to one embodiment of the invention.

FIG. 8 is a diagram illustrating the separation of registers 70 in an example input synchronous HDL design description into individual state elements 72 for analysis, according to one embodiment of the invention. Simply because a group of state elements logically formed a multi-bit register in the original design does not imply this grouping will be optimal for the resulting Micropipeline design. Registers may be split among different stages of the resulting Micropipeline design, fall under control of different asynchronous handshakes, and be clocked by different local clocks. During the state aggregation processing step 42, optimal clustering of individual state elements is determined.

Figure 9:
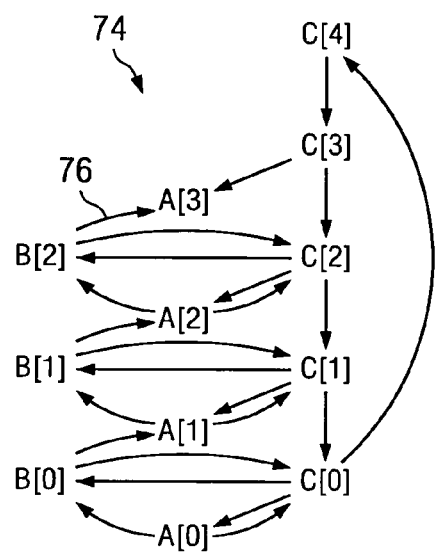
FIG. 9 is a diagram illustrating the dataflow graph formed from dependencies and antidependencies of each storage element in an example design, according to one embodiment of the invention.

FIG. 9 is a diagram illustrating the dataflow graph 74 formed from dependencies and antidependencies of each storage element in an example design, according to one embodiment of the invention. Each link 76 in the dataflow graph is drawn as an arrow. The pointed head of each arrow is an antidependency of its tail. The tail of each arrow is a dependency of its head. This dataflow graph is generated by dataflow analysis processing step 78.

The present invention interprets antidependencies on the dataflow graph 74 as forks and creates Micropipeline handshake acknowledge signals for them. Similarly, dependencies in the graph are interpreted as joins and Micropipeline handshake request signals are created for them.

Figure 10:
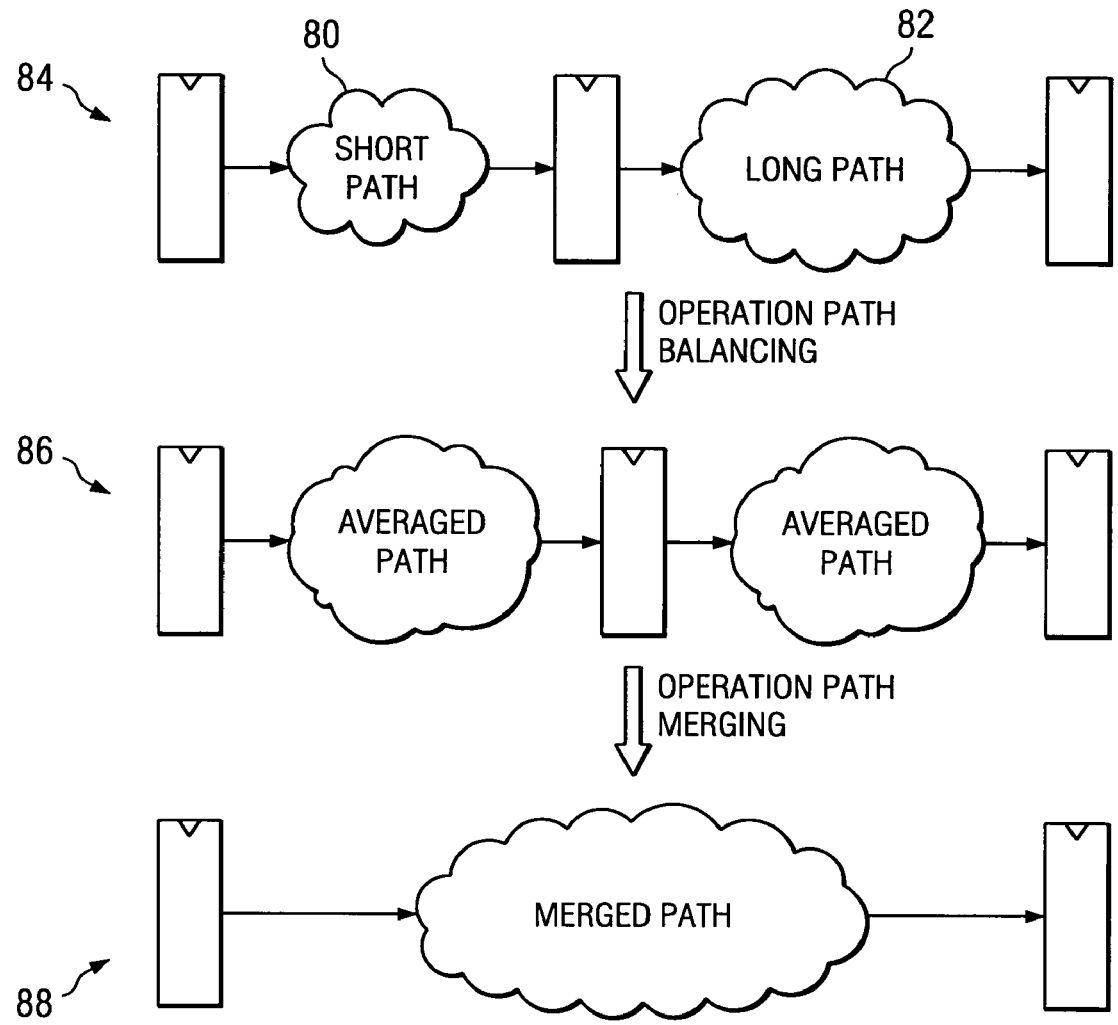
FIG. 10 is a diagram illustrating the balancing or merging of Micropipeline operations on the basis of the length of their logic datapaths, according to one embodiment of the invention.

FIG. 10 is a diagram illustrating the balancing or merging of Micropipeline operations on the basis of the length of their logic datapaths, according to one embodiment of the invention. If one operation X handshakes with another operation Y with no forking or joining with any other Micropipeline stages in between, the register in between the stages can be moved optimally. In the figure, an operation having a short datapath 80 in series with an operation having a long datapath 82 is first balanced into two operations 84 and 86. Since in an asynchronous design, pipelining long operations without intermediate results has no purpose, the register may also be outright removed. The figure shows the balanced paths 84 and 86 merged at 88.

Figure 11:
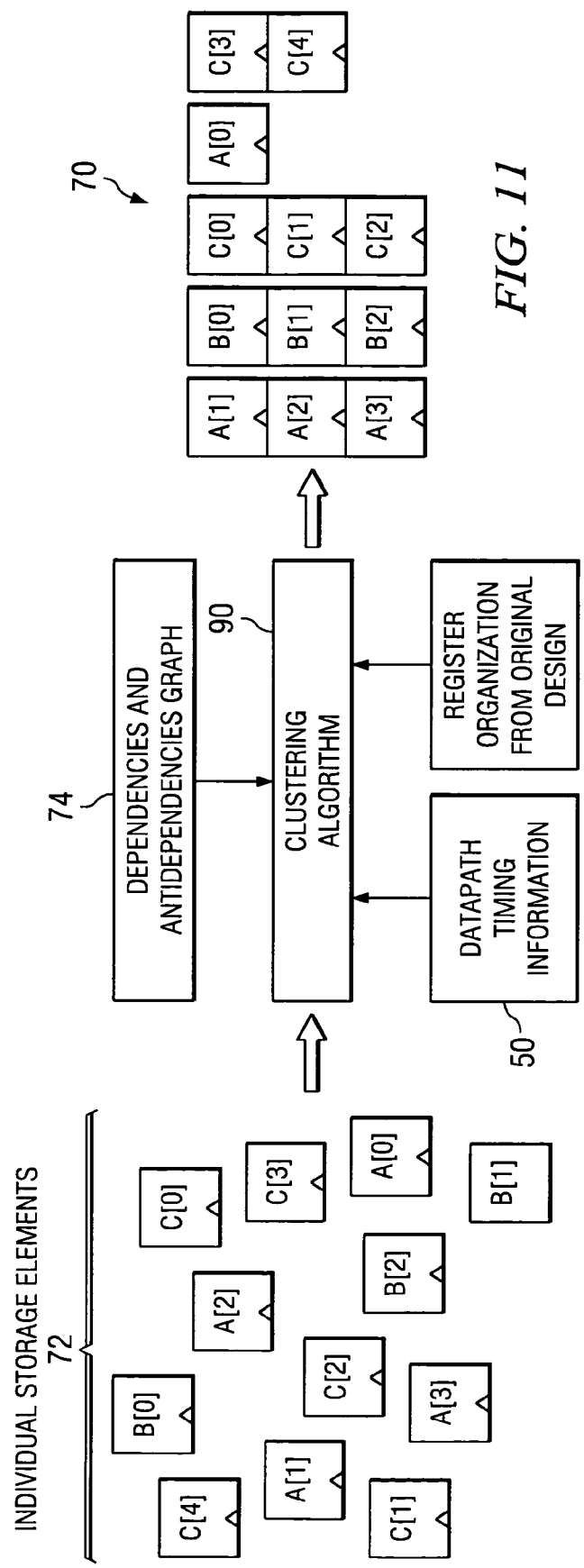
FIG. 11 is a diagram illustrating an example of the optimal clustering of storage elements into Micropipeline stages to be controlled by local handshakes, according to one embodiment of the invention.

FIG. 11 is a diagram illustrating an example of the optimal clustering of storage elements 72 into Micropipeline stages 70 to be controlled by local handshakes, according to one embodiment of the invention. This clustering algorithm uses hard and fast rules from the dataflow graph 74, but also seeks optimality by using extra information such as the datapath timing information 50. A clustering algorithm 90 may typically employ any one or more of, but is not limited to the employment of, the following means: a cost function, statistical decision making, a neural or fuzzy network, heuristics, or expert-system approaches. In this context, an expert-system might itself employ information retained about the original logical grouping of state elements into multi-bit registers in the original synchronous design.

The scope of the present disclosure includes any novel feature or combination of features disclosed therein either explicitly or implicitly or any generalization thereof irrespective of whether or not it relates to the claimed invention or mitigates any or all of the problems addressed by the present invention. The applicant hereby gives notice that new claims may be formulated to such features during the prosecution of this application or of any such further application derived therefrom. In particular, with reference to the appended claims, features from dependant claims may be combined with those of the independent claims in any appropriate manner and not merely in the specific combinations enumerated in the claims.

What is claimed:

1. An apparatus, comprising:
a software preprocessor enabled to accept a description of a synchronous design as input and to emit a description of an equivalent design based on asynchronous handshakes as output;
wherein each register in the design is taken apart into separate flip flops for independent fine-grain analysis;
wherein each flip flop is analyzed as a vertex on graphs of dependencies and antidependencies with other flip flops, inputs and outputs; and
wherein a clustering algorithm is used to collapse the analysis graphs and re-combine individual flip-flops or latches into registers sharing the same local clock pulse circuitry.

2. An apparatus, comprising:
a software preprocessor enabled to accept a description of a synchronous design as input and to emit a description of an equivalent design based on asynchronous handshakes as output;
wherein each register in the design is taken apart into separate flip flops for independent fine-grain analysis; and
wherein a clustering algorithm employs at least one of the group of: a cost function; a classical statistical pattern recognition; a neural network; and heuristics.

3. An apparatus, comprising:
a software preprocessor enabled to accept a description of a synchronous design as input and to emit a description of an equivalent design based on asynchronous handshakes as output;
wherein each register in the design is taken apart into separate flip flops for independent fine-grain analysis;
wherein a clustering algorithm employs timing constraints as an auxiliary input; and
wherein the clustering algorithm modifies the design by adding and removing flip flops as necessitated by timing constraints.

4. A method, comprising the steps of:
enabling a description of a synchronous design as input of a software preprocessor;
emitting a description of an equivalent design based on asynchronous handshakes as output of said preprocessor;
wherein each register comprises separate flip flops;
wherein each flip flop is analyzed as a vertex on graphs of dependencies and antidependencies with other flip flops, inputs and outputs; and
wherein a clustering algorithm is used to collapse the analysis graphs and re-combine individual flip-flops or latches into registers sharing the same local clock pulse circuitry.

5. A method, comprising the steps of:
enabling a description of a synchronous design as input of a software preprocessor;
emitting a description of an equivalent design based on asynchronous handshakes as output of said preprocessor;
wherein each register comprises separate flip flops; and
wherein a clustering algorithm employs at least one of the group of: a cost function; a classical statistical pattern recognition; a neural network; and heuristics.

6. A method, comprising the steps of: enabling a description of a synchronous design as input of a software preprocessor;

emitting a description of an equivalent design based on asynchronous handshakes as output of said preprocessor;

wherein each register comprises separate flip flops;

wherein a clustering algorithm adds and removes flip flops as necessitated by timing constraints; and wherein the clustering algorithm adds and removes flip flops as necessitated by timing constraints.

* * * * *